FREQUENCY DIVIDER CIRCUIT

Filed Sept. 9, 1966 2 Sheets-Sheet 1

INVENTOR
DONALD FIRTH
BY Jeffers & Young
ATTORNEYS

INVENTOR
DONALD FIRTH
BY Jeffers & Young
ATTORNEYS

United States Patent Office 3,517,211
Patented June 23, 1970

3,517,211
FREQUENCY DIVIDER CIRCUIT
Donald Firth, Fort Wayne, Ind., assignor to The Magnavox Company, Fort Wayne, Ind., a corporation of Delaware
Filed Sept. 9, 1966, Ser. No. 578,283
Int. Cl. H03k 3/26, 21/00
U.S. Cl. 307—225 8 Claims

ABSTRACT OF THE DISCLOSURE

A bistable multivibrator having two electron discharge devices is provided with a common pulse input circuit and two respective resistor-capacitor series timing circuits. The junction of the resistor and capacitor of each timing circuit is respectively coupled to the main current path of each of the two electron discharge devices and to the common input circuit for providing a voltage that prevents the input pulses from switching the states of the electron discharge devices for a predetermined time.

Figure 1:
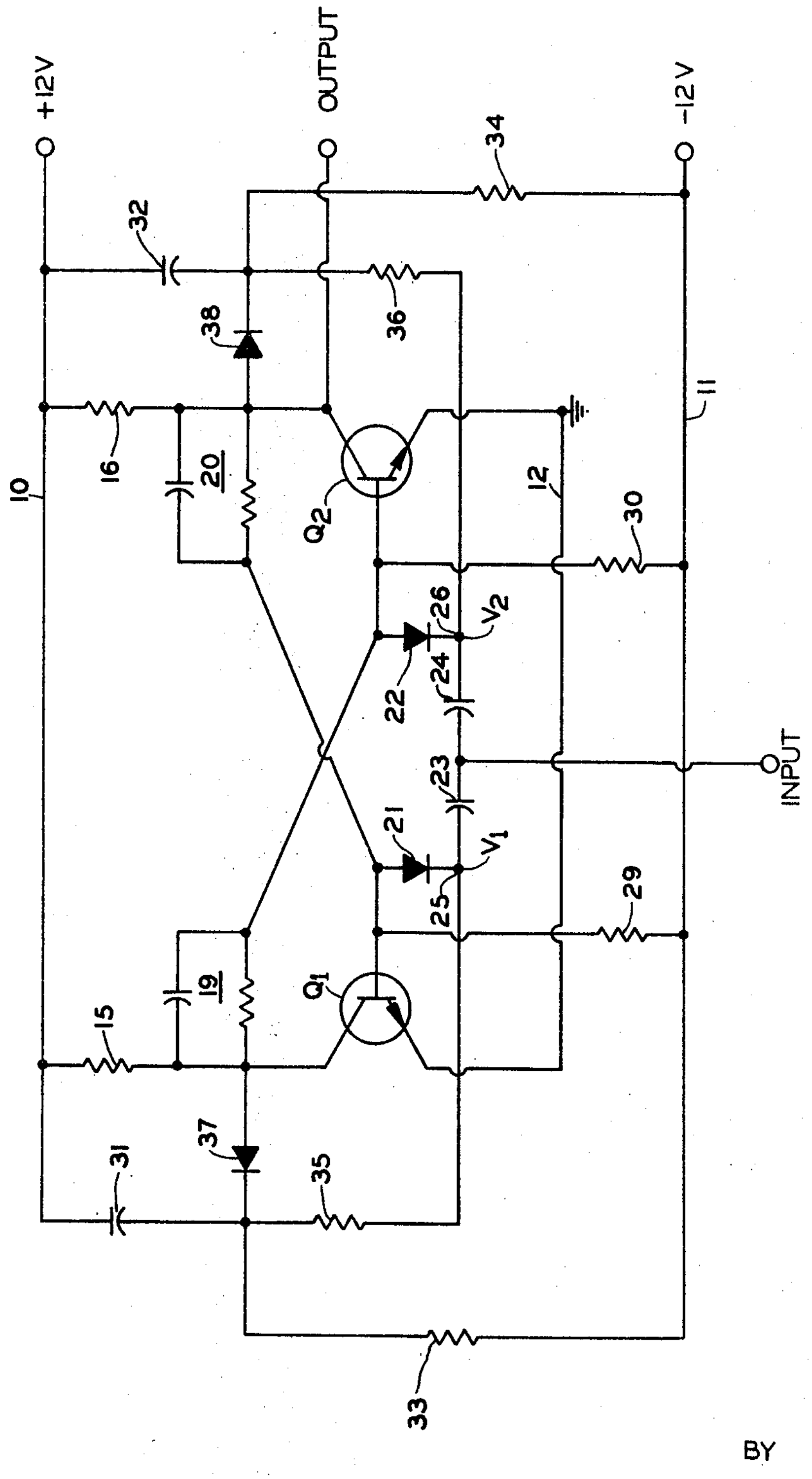

My invention relates to a frequency divider or counter circuit, and particularly to a relatively simple frequency divider or counter circuit for reliably dividing or counting by the more than two.

In circuit applications which require a relatively simple circuit for dividing the frequency of applied pulses by more than two, a multivibrator type circuit has been used. Such a multivibrator circuit includes a timing network which, after a predetermined number of applied pulses, provides an output pulse in response to the next applied pulse, and which then repeats the cycle to provide frequency division or counting. However, such a simple circuit is not too reliable in its operation, particularly where a consistent and accurate high order of division or counting is needed. This is particularly true where the operating conditions are severe or cover a wide range. For example, the frequency divider may be required to operate over a wide range of environmental conditions such as temperature. Or the supply voltage may vary widely or rapidly. Or the repetition rate of the input pulses may vary. Therefore, where reliable frequency division or counting by more than two is necessary or desirable, the relatively reliable and consistent multi-stage binary frequency divider is used. However, this binary frequency divider requires more stages and circuit components, and hence is larger, heavier, and more expensive. There is, therefore, a need for a more reliable counter or frequency divider that can count or divide by more than two and that is relatively simple, compact, and inexpensive.

Accordingly, a primary object of my invention is to provide a frequency divider or counter circuit than can divide by more than two and that is relatively simple, compact, and inexpensive.

Another object of my invention is to provide a frequency divider or counter which can divide or count by more than two and which has one relatively simple multivibrator circuit.

Another object of my invention is to provide an improved timing circuit for use with a multivibrator circuit for frequency dividing or counting.

Briefly, these and other objects are achieved in accordance with my invention by a multivibrator circuit comprising two electron current control devices such as transistors. The two transistors are coupled in conventional bistable multivibrator fashion and supplied with appropriate direct current power. A regenerative circuit is coupled between the emitter-collector circuit of each transistor and the base of the other transistor. Trigger or input impulses are coupled to the base of each transistor through appropriate differentiating, isolating, and pulse steering elements. Output signals may be derived from the emitter-collector circuit of either or both transistors. In accordance with my invention, I provide a resistor-capacitor timing circuit for each transistor. Each timing circuit is coupled across the power circuit. Each capacitor of one transistor is respectively coupled by a steering resistor to the base circuit of the other transistor so as to apply a voltage that decreases with time to this base circuit when the respective transistor has been turned on. The trigger pulses, which would normally switch a transistor off, are opposed or blocked by this voltage until it decreases to a predetermined lower value, and thus prevents switching until that predetermined lower value is reached. The time constant of the two timing circuits may be independently controlled so that each transistor is not permitted to switch for a predetermined number of trigger pulses. Since each of the two timing circuits provides a respective part of the frequency division or counting, the decreasing blocking voltage provided by each timing circuit has, for a given division ratio, a greater change per time period between trigger pulses than would be the case if only one timing circuit were used. Hence, the desired action of this decreasing blocking voltage is less sensitive to changes in operating conditions. But, at the same time, frequency division or counting by the sum or net effect of both timing circuits is provided with one relatively simple multivibrator circuit. The use of a bistable multivibrator makes the circuit less likely to oscillate.

The subject matter which I regard as my invention is particularly pointed out and distinctly claimed in the claims. The structure and operation of my invention, together with further objects and advantages, may be better understood from the following description given in connection with the accompanying drawing, in which:

FIG. 1 shows a circuit diagram of a preferred embodiment of my frequency divider circuit; and FIG. 2*a* through 2*e* show waveforms illustrating the operation of the circuit of FIG. 1.

In FIG. 1, the circuit in accordance with my invention utilizes two NPN type transistors Q1 and Q2, although PNP type transistors or vacuum tubes may also be used. Suitable direct current power, such as plus and minus 12 volts, is supplied at a positive bus 10 and a negative bus 11. A reference bus 12, which may be connected to ground as shown, is also provided. The collectors of the transistors Q1 and Q2 are respectively connected to the positive bus 10 through resistors 15, 16, and the emitters of the transistors Q1 and Q2 are connected to the reference bus 12. The collector of the transistor Q1 is coupled to the base of the transistor Q2 through a regenerative resistor and capacitor circuit 19. Likewise, the collector of the transistor Q2 is coupled to the base of the transistor Q1 through a regenerative resistor and capacitor circuit 20. The base of the transistor Q1 is coupled to an input circuit through a serially connected diode rectifier 21 and a capacitor 23, and the base of the transistor Q2 is also coupled to the same input circuit through a serially connected diode rectifier 22 and capacitor 24. The junction of the rectifier 21 and the capacitor 23 is indicated by the numeral 25, this junction 25 having a voltage V1. The junction of the rectifier 22 and capacitor 24 is indicated by the numeral 26, this junction 26 having a voltage V2. These junctions 25, 26 and voltages V1 and V2 are referred to in the explanation of the operation of my invention. The bases of the transistors Q1 and Q2 are respectively coupled to the negative bus 11 through resistors 29, 30.

The circuit as thus far described is conventional. Negative-going trigger pulses applied to the input cause the one transistor that is turned on to be turned off. When this one transistor is turned off, it provides a positive-going pulse through its respective regenerative circuit to the base of the other transistor to turn that other transistor on. Output pulses may be derived from an appropriate point in the emitter-collector path of either of the transistors Q1 and Q2. In FIG. 1, I have shown the output as being derived from the collector of the transistor Q2. In accordance with my invention, I provide a timing circuit for one or preferably both of the transistors Q1 and Q2. With respect to the transistor Q1, this timing circuit comprises a capacitor 31 and a resistor 33 coupled in series between the positive and negative buses 10, 11. The junction of the capacitor 31 and the resistor 33 is coupled through a diode rectifier 37 to the collector of the transistor Q1 for the purpose of establishing the charge on the capacitor 31 when the transistor Q1 is in the off condition. This junction is also coupled through a resistor 35 to the junction 25 for providing a blocking voltage to the input trigger pulses. The timing circuit for the transistor Q2 comprises a capacitor 32 and a resistor 34 coupled in series between the positive and negative buses 10, 11. The junction of the capacitor 32 and the resistor 34 is coupled through a diode rectifier 38 to the collector of the transistor Q2 for the purpose of establishing the charge on the capacitor 32 when Q2 is in the off condition. This junction is also coupled through a resistor 36 to the junction 26 for providing a blocking voltage to the input trigger pulses with respect to the transistor Q2. As will be explained in connection with the waveforms of FIG. 2, the voltages at the junctions 25, 26, respectively, provide a blocking condition for the transistor which is turned on, and thus prevents that transistor which is turned on from being turned off for a predetermined length of time.

FIGS. 2*a* through 2*e* show five waveforms all plotted along a common time axis. The waveform of FIG. 2*a* shows the voltage V1 at the junction 25; the waveform of FIG. 2*b* shows the voltage V2 at the junction 26; the waveform of FIG. 2*c* shows the collector voltage of the transistor Q1 under the on and off conditions; the waveform of FIG. 2*d* shows the collector voltage of the transistor Q2 under the on and off conditions; and the waveform of FIG. 2*e* shows the applied input pulses. These input pulses are assumed to have a substantially uniform frequency and occur at the times indicated. These input pulses are negative-going for the circuit shown in FIG. 1, but for other types of circuits may be positive-going pulses. As an initial condition, it has been assumed that the input pulse at the time $t_0$ has turned the transistor Q2 off. When the transistor Q2 is turned off, its collector becomes positive, and this is coupled through the circuit 20 to the base of the transistor Q1, turning the transistor Q1 on. This condition or switching is shown by FIGS. 2*c* and 2*d* at the time $t_0$. The voltage V1 in FIG. 2*a* is at a maximum positive value because the transistor Q1 was previously turned off and its collector was at a positive voltage. This positive voltage was coupled through the diode 37 and the resistor 35 to make the voltage V1 have its maximum positive value. Although the transistor Q1 is turned on at the time $t_0$ and its collector is at a relatively low positive voltage, the voltage V1 does not decrease immediately. This is because the capacitor 31 must charge toward the voltage on the negative bus 11 through the resistor 33. Hence, the voltage V1 decreases exponentially as shown in FIG. 2*a* beginning at the time $t_0$. The rate of this decrease is, of course, determined by the size of the capacitor 31 and the resistor 33. While the voltage V1 is at a sufficiently positive value, it blocks the input pulses which occur at the time $t_1$ and $t_2$ so that the transistor Q1 cannot be turned off at these times. At some time between the time $t_2$ and the time $t_3$, the voltage V1 decreases sufficiently so that the trigger pulse at the time $t_3$ can overcome any remaining positive voltage V1 and turn the transistor Q1 off. This turning off is indicated by the waveform in FIG. 2*c*. With respect to the voltage V2 at time $t_0$, it rapidly became positive since the transistor Q2 was turned off, and the capacitor 32 could be rapidly discharged through the relatively low impedance path of the diode rectifier 38 and the resistor 16. Hence, the voltage V2 became positive at some time between the times $t_0$ and $t_1$.

Figure 2:
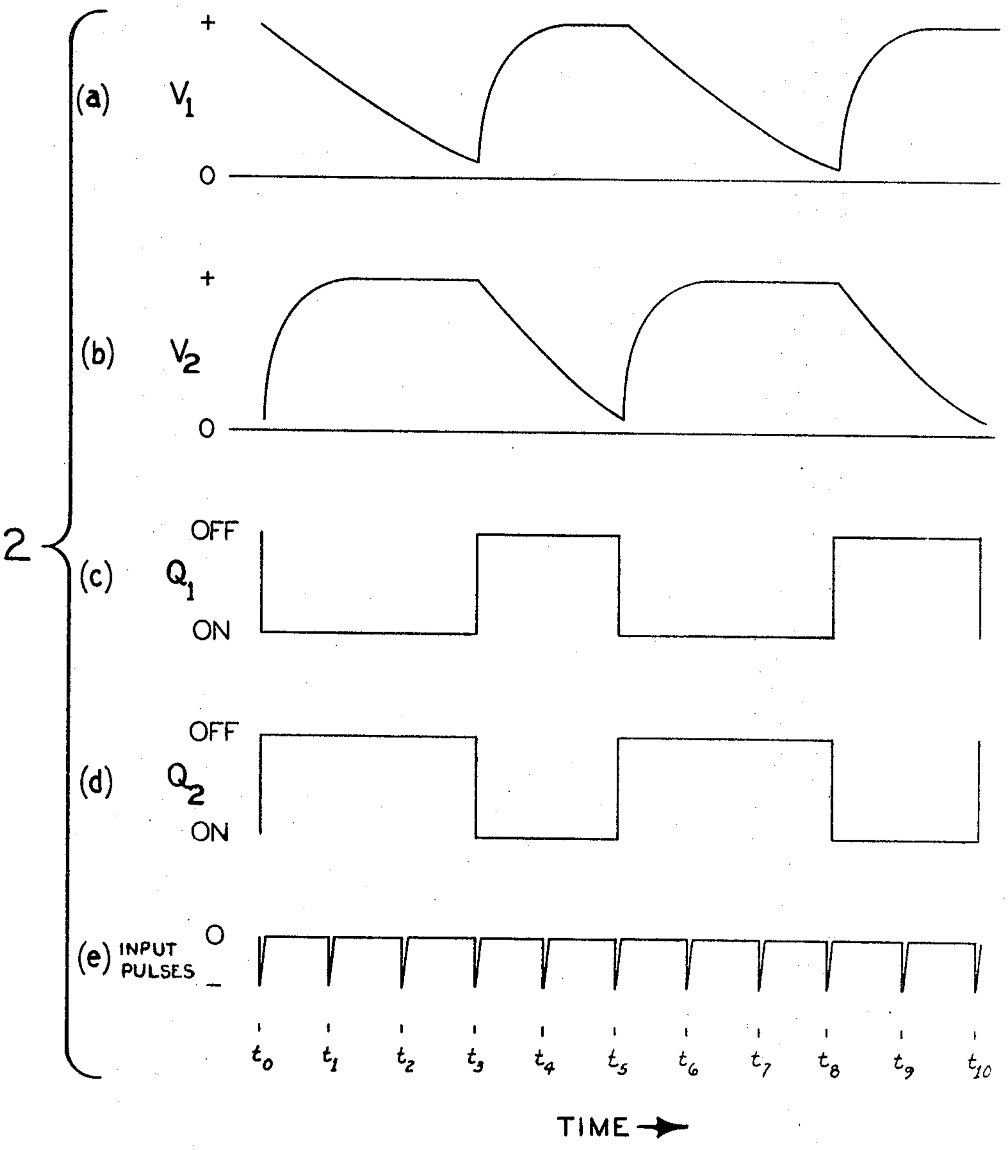

At the time $t_3$ when the transistor Q1 was turned off, its collector became positive and thus turned the transistor Q2 on as shown in FIG. 2*d*. However, the voltage V2 does not decrease immediately, because the capacitor 32 must charge at a rate determined by the size of the capacitor 32 and the resistor 36. This size or time constant is, in the example shown in FIG. 2*d*, smaller than the size or time constant for the capacitor 31 and the resistor 33. Thus, at some time between the times $t_4$ and $t_5$, the voltage V2 becomes sufficiently small so that the negative-going trigger pulse at the time $t_5$ can turn the transistor Q2 off. This is indicated by the waveform in FIG. 2*d* at the time $t_5$. When the transistor Q2 is turned off, the transistor Q1 is turned on. And, during the time between the times $t_3$ and $t_5$, the voltage V1 has become positive again because of the relatively short time constant for discharging the capacitor through the resistor 15 and the rectifier 37. Thus, at the time $t_5$, the initially assumed condition is present again and the cycle repeats itself as between the times $t_5$ and $t_{10}$. Further cycles take place as long as the circuit is operative. An output can be derived from the circuit of FIG. 1 at any desired point in the emitter-collector circuits of the transistors Q1 and Q2. For example, the output may be derived from the collector of the transistor Q2 as indicated, and utilized when the transistor Q2 is turned off. An examination of FIG. 2 shows that the transistor Q2 is turned off once for every five applied input pulses.

It will be seen that the timing circuit comprising the capacitor 31 and the resistor 33 blocks input pulses for three time periods, and the timing circuit comprising the capacitor 32 and the resistor 34 blocks input pulses for two time periods. Since each of the timing circuits contributes to blocking the input pulses, the voltage at which an input pulse becomes effective is less critical. In other words, the decreasing voltage V1 must be maintained for only three time periods, and the decreasing voltage V2 must be maintained for only two time periods. But the two decreasing voltages provide frequency division for a total of five time periods. The shorter times for the two decreasing voltages permit greater tolerances and operating conditions than a longer time for a single decreasing voltage. Thus, the combined effect of two separate timing circuits provides the desired frequency division or counting, but does so in a manner which is less susceptible to changes in circuit conditions, such as temperature or voltage changes, or small changes in the input waveform repetition rate. Therefore, the use of two relatively simple timing circuits provides an improved operation.

While I have shown timing circuits which respectively block input pulses for three and two periods respectively, it is to be understood that other times of blocking may be provided. For example, each timing circuit may block input pulses for any length of time from zero to six (as an example) time periods, thus providing any counting or frequency division from two to twelve. With the addition of or with the use of more accurate circuit components and for more stable operating conditions, even greater frequency division or counting can be provided by the relatively simple multivibrator circuit and timing circuit in accordance with my invention. Persons skilled in the art will appreciate that modifications may be made. As already pointed out. PNP type transistors may be used used in place of the NPN type transistors shown, and various blocking periods may be provided by the timing circuits. Therefore, while my invention has been described with reference to a particular embodiment, it is to be understood that modifications may be made without departing from the spirit of the invention or from the scope of the claims.

What I claim as new and desire to secure by Letters Patent of the United States is:

1. A frequency divider circuit for producing an output signal in response to a predetermined number of applied input pulses comprising:

(a) first and second electron discharged devices each having a main current path and a control electrode;

(b) a source of direct current potential;

(c) circuit means coupling said first and second electron discharge devices in regenerative fashion with said source of direct current potential for responding to an input pulse and switching the conductive state of said electron discharge devices;

(d) first and second timing circuits each having a serially connected resistor and capacitor respectively coupled across said source of direct current potential;

(e) means for coupling the junction of said resistor and capacitor of each of said timing circuits to a respective one of said control electrodes of said first and second electron discharge devices for providing a respective voltage at each of said control electrodes that prevents said input pulses from switching the states of said first and second electron discharge devices for a predetermined time, said respective voltages being substantially continuous, smooth and applied at all times to the associated coupling means to prevent input pulses from switching in the aforementioned manner.

2. A frequency divider circuit for producing an output signal in response to a predetermined number of applied input pulses comprising:

(a) first and second current control devices each having a main current path and a control electrode;

(b) a source of direct current potential;

(c) means coupling said first and second current control devices to said source of direct current potential;

(d) first and second regenerative circuits respectively coupled between the main current path of each of said current control devices and the control electrode of the other of said current controlled devices for switching the conductive states of said current control devices so that when one of said current control devices is turned off the other of said current control devices is turned on;

(e) an input circuit for applying said input pulses to said control electrodes of said current control devices and switching the conductive states of said current control devices;

(f) first and second timing circuits each comprising a resistor and a capacitor connected in series across said source of direct current potential; and (g) means respectively coupling the junction of said resistor and capacitor of each of said timing circuits to said main current paths of said first and second current control devices and to said input circuit for providing respective voltages that prevent said input pulses from switching the conductive states of the respective current control devices for a predetermined length of time, said respective voltages being substantially continuous, smooth and applied at all times to the associated coupling means to prevent input pulses from switching in the aforementioned manner.

3. The frequency divider of claim 2 wherein said coupling means between said timing circuits and said main current paths comprise first and second rectifier devices and said coupling means between said timing circuits and said input circuit comprise resistors having a relatively short time constant discharging path for said first said capacitors.

4. A frequency divider circuit comprising:

(a) first and second transistors each having an emitter, a collector, and a base;

(b) a source of direct current potential;

(c) means coupling said emitter and collector of each of said transistors to said source of direct current potential;

(d) a first regenerative circuit coupled between said base of said first transistor and the emitter-collector circuit of said second transistor;

(e) a second regenerative circuit coupled between said base of said second transistor and the emitter-collector circuit of said first transistor;

(f) first and second input circuits respectively coupled to said bases of said first and second transistors for applying pulses thereto and switching the conductive state of said first and second transistors so that when one of said transistors is conducting the other of said transistors is turned off;

(g) a first resistor-capacitor series timing circuit coupled across said source of direct current potential;

(h) a second resistor-capacitor series timing circuit coupled across said source of direct current potential;

(i) a first low impedance discharging circuit coupled between the junction of said first resistance-capacitor series timing circuit and said emitter-collector circuit of said first transistor;

(j) a second low impedance discharging circuit coupled between the junction of said second resistor-capacitor series timing circuit and said emitter-collector circuit of said second transistor;

(k) a first coupling circuit coupled between said junction of said first resistor-capacitor series timing circuit and said first input circuit; and (l) a second coupling circuit coupled between said junction of said second resistor-capacitor series timing circuit and said second input circuit, said first and second coupling circuits providing a respective voltage which prevents input pulses from switching the state of said first and second discharging circuits for a predetermined time by means of a substantially continuous, smooth and applied at all times to said first and second coupling circuits.

5. The frequency divider of claim 4 wherein said first and second transistors are NPN type transistors and wherein said first and second input circuits couple negative-going pulses to said bases for turning the conducting transistor off.

6. The frequency divider of claim 4 wherein said first and second transistors are PNP type transistors and wherein said first and second input circuits couple positive-going pulses to said bases for turning the conducting transistor off.

7. The frequency divider circuit of claim 5 wherein said first and second transistors are NPN type transistors and wherein said first and second input circuits couple positive-going pulses to said bases for turning the nonconducting transistor on.

8. The frequency divider of claim 4 wherein said first and second transistors are PNP type transistors and wherein said first and second input circuits couple negative-going pulses to said bases for turning the nonconducting transistor on.

References Cited

UNITED STATES PATENTS

| | | | |
|---|---|---|---|
| 3,046,413 | 7/1962 | Clapper | 307—292 X |
| 3,351,781 | 11/1967 | Johnsen | 307—292 X |

| | | | |
|---|---|---|---|
| 2,903,607 | 9/1959 | Danner et al. | 307—289 X |
| 3,311,754 | 3/1967 | Linder et al. | 307—292 |
| 3,351,781 | 11/1967 | Johnson | 307—292 |

DONALD D. FORRER, Primary Examiner

J. D. FREW, Assistant Examiner

U.S. Cl. X.R.

307—226, 289, 292